United States Patent
Cosand et al.

(10) Patent No.: US 7,349,471 B2
(45) Date of Patent: Mar. 25, 2008

(54) PPM RECEIVING SYSTEM AND METHOD USING TIME-INTERLEAVED INTEGRATORS

(75) Inventors: Albert Cosand, Agoura Hills, CA (US); Donald A. Hitko, Malibu, CA (US); Michael Yung, Los Angeles, CA (US)

(73) Assignee: The Boeing Company, Chicago, IL (US)

( * ) Notice: Subject to any disclaimer, the term of this patent is extended or adjusted under 35 U.S.C. 154(b) by 975 days.

(21) Appl. No.: 10/707,076

(22) Filed: Nov. 19, 2003

(65) Prior Publication Data

US 2005/0105606 A1    May 19, 2005

(51) Int. Cl.
| | |
|---|---|
| H03K 7/04 | (2006.01) |
| H03K 7/06 | (2006.01) |
| H03K 9/04 | (2006.01) |
| H03K 9/06 | (2006.01) |

(52) U.S. Cl. .................. 375/239; 375/346; 375/259
(58) Field of Classification Search ................ 375/239, 375/346, 259
See application file for complete search history.

(56) References Cited

U.S. PATENT DOCUMENTS

| | | | |
|---|---|---|---|
| 5,640,160 A | | 6/1997 | Miwa |
| 5,654,978 A | | 8/1997 | Vanderpool et al. |
| 5,684,871 A | * | 11/1997 | Devon et al. ............... 375/239 |
| 5,691,665 A | * | 11/1997 | Ohtani ....................... 329/313 |
| 6,577,691 B2 | | 6/2003 | Richards et al. |
| 2003/0235246 A1 | * | 12/2003 | Dress et al. ................ 375/238 |
| 2005/0105606 A1 | * | 5/2005 | Cosand et al. .............. 375/239 |

OTHER PUBLICATIONS

Chan and Lawrence, "An ASIC Chipset for Optical Communications", GaAs IC Symposium, 1993, pp. 303-306, Galaxy Microsystems, Inc., San Jose, California.
Karvonen, Riley, and Kostamovaara, "A Low Noise Quadrature Subsampling Mixer", IEEE International Symposium on Circuits & Systems, 2001, pp. IV 790-IV 793, Department of Electrical Engineering and InfoTech Oulu, University of Oulu, 90571 Findland.
Ghassemlooy and Wickramasinghe, "A Low Cost Sub-Carrier Multiplexed PPM for Optical Fibre Transmission Systems". IEEE, 1998, pp. 99-107, Contributed Paper, United Kingdom.

* cited by examiner

*Primary Examiner*—David C. Payne
*Assistant Examiner*—Nader Bolourchi
(74) *Attorney, Agent, or Firm*—Ostrager Chong Flaherty & Broitman, P.C.

(57) ABSTRACT

A communication receiver (30) includes a data receiver (34) that receives a pulse-position modulated signal (38). A clock circuit (70) separates a reference clock signal (36) into multiple coordinating clock signals A, B, and C. Multiple time integrators (78) are gated to generate multiple time-integrated signals in response to the pulse-position modulated signal (38) and the coordinating clock signals A, B, and C. A combiner (96) forms a demodulated signal from the time-integrated signals IntA, IntB, and IntC.

32 Claims, 3 Drawing Sheets

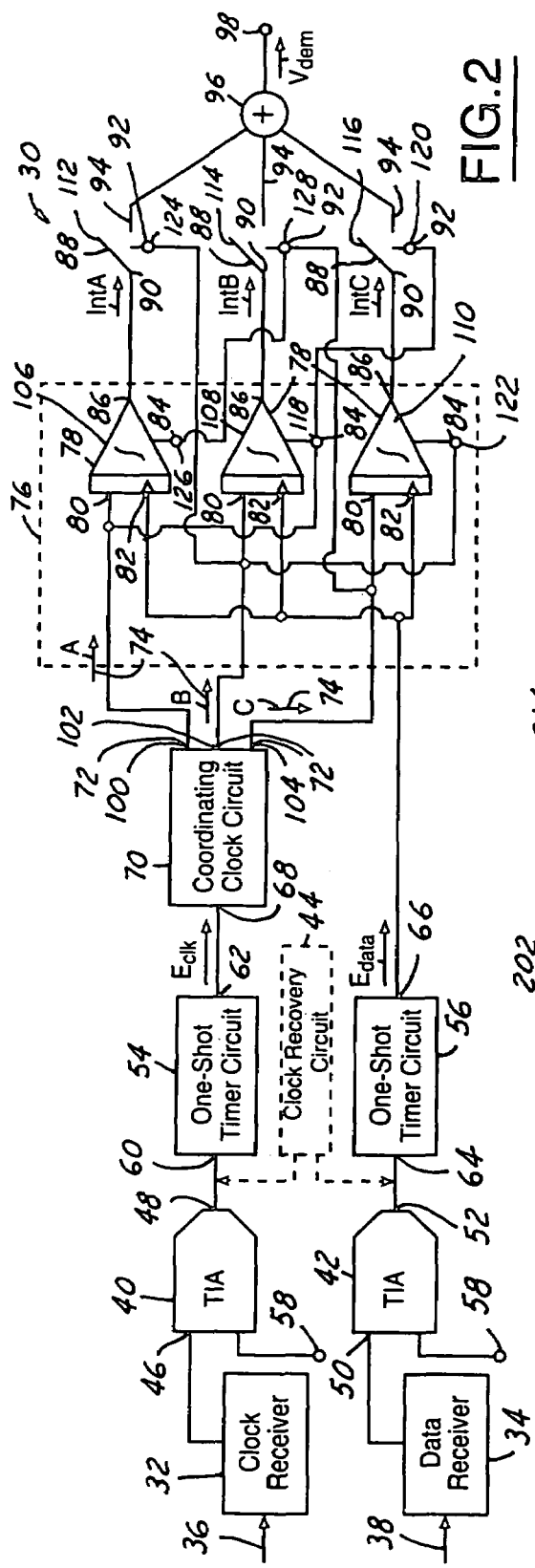
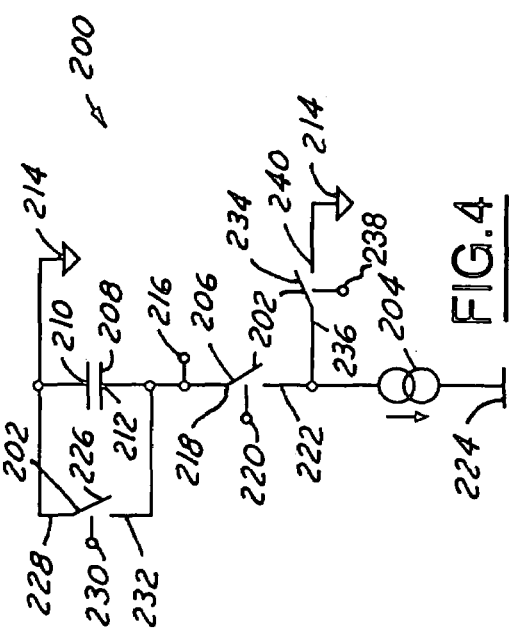

PPM RECEIVING SYSTEM AND METHOD USING TIME-INTERLEAVED INTEGRATORS

BACKGROUND OF INVENTION

The present invention relates generally to high data rate communication systems. More particularly, the present invention is related to a system and method of extracting information from pulse-position modulated (PPM) signals.

Existing high data rate optical networks, such as the Internet backbone networks embody OC-192 or OC-768 standards, which have data transfer rates of 10 Gbit/s and 40 Gbits/sec, respectively. The existing networks typically rely upon a clock and a data recovery scheme that utilizes amplitude modulation (AM).

The available signal-to-noise ratios and the lengthy transmission distances involved within these systems have limited the modulation formats and have necessitated a high degree of error-correction coding overhead. The modulation has been limited to one bit per symbol ON-OFF keying. The error-correction coding overhead allows for the bit-error rates that are required of the Internet networks.

The general approach to obtaining the higher data rates in Internet networks and the like has been to increase the clock rate and to focus engineering attention on solving the problems associated with the transmitting and receiving of ever-higher bandwidths, which are associated with higher data rates. In general, even without transmitting and receiving at high data rates, AM systems are sensitive to attenuation and amplitude type noise, which degrades the signal-to-noise ratio. The AM systems also tend to exhibit power and signal losses. In AM systems when data rates are increased noise sensitivity and signal losses tend to increase. Signal losses can include dielectric loss and skin-effect loss, as well as loss from connectors, line impedance mismatches, series capacitors, passive equalizers and pulse shaping, and differential and signal ended transmissions, or signal transmissions.

Some other available communication systems incorporate the use of pulse-position modulation (PPM) for the transmission and reception of data. PPM does not exhibit the same noise and signal losses as that of AM type systems. Since signals are modulated in time, the signals are less sensitive to amplitude noise and power losses. However, PPM systems are constrained by receiver accuracy to significantly lower data rates. Current PPM systems monitor positions of pulses within time slots. As data rates increase, width of the time slots decreases, resulting in the need for a more accurate receiver.

Several PPM type communication systems do exist that are capable of receiving the high data rates, but unfortunately these systems rely upon optical techniques that require hardware that is complex, costly, and of a large physical form factor.

Thus, there exists a need for an improved PPM receiver and method of extracting information from PPM signals that supports high data rates, has high signal-to-noise performance, is robust, simple, inexpensive, and has reduced form factor size.

SUMMARY OF INVENTION

The present invention provides a communication system and method of extracting information from pulse-position modulated (PPM) signals. A communication receiver is provided and includes a data receiver that receives a pulse-position modulated signal. A clock circuit separates a reference clock signal into multiple coordinating clock signals. Multiple time integrators are gated to generate multiple time-integrated signals in response to the pulse-position modulated signal and the coordinating clock signals. A combiner forms a demodulated signal from the time-integrated signals.

The embodiments of the present invention provide several advantages. One such advantage that is provided by several embodiments of the present invention is the provision of a PPM receiver that incorporates the use of time-interleaving integrators and analog signal processing. In so doing, the stated embodiments provide a robust PPM receiver with increased data rate reception capability and improved timing accuracy. In being more accurate, the stated embodiments provide improved resolution and thus improved signal-to-noise performance.

Another advantage that is provided by multiple embodiments of the present invention is the provision of parallel processing time-interleaved integrated signals within a PPM receiver. The parallel processing allows for increased bit or data rates with minimal time allotted for resetting of components.

Furthermore, the present invention provides a PPM receiver that is simple, inexpensive, and has reduced form factor size.

Moreover, the multiple embodiments of the present invention provide versatility in the ability to be utilized in various applications.

The present invention itself, together with further objects and attendant advantages, will be best understood by reference to the following detailed description, taken in conjunction with the accompanying drawing.

BRIEF DESCRIPTION OF DRAWINGS

FIG. 2 is a schematic and block diagrammatic view of a PPM receiver in accordance with an embodiment of the present invention;

FIG. 4 is a simplified schematic diagram of a sample integrator that may be utilized within the PPM receiver in accordance with an embodiment of the present invention;

DETAILED DESCRIPTION

While the present invention is described with respect to a system and method of extracting information from pulse position modulation (PPM) signals, the present invention may be adapted to be used in various applications known in the art. The present invention may be applied to various communication systems, broadband systems, Internet based systems, satellite systems, telecommunication systems, optical communication systems, fiber optic systems, and network systems, as well as other communication systems known in the art. The present invention may be applied to communication systems that utilize pulse position modulation and to communication systems that utilize other time modulation techniques.

In the following description, various operating parameters and components are described for one constructed embodiment. These specific parameters and components are included as examples and are not meant to be limiting.

Figure 1:
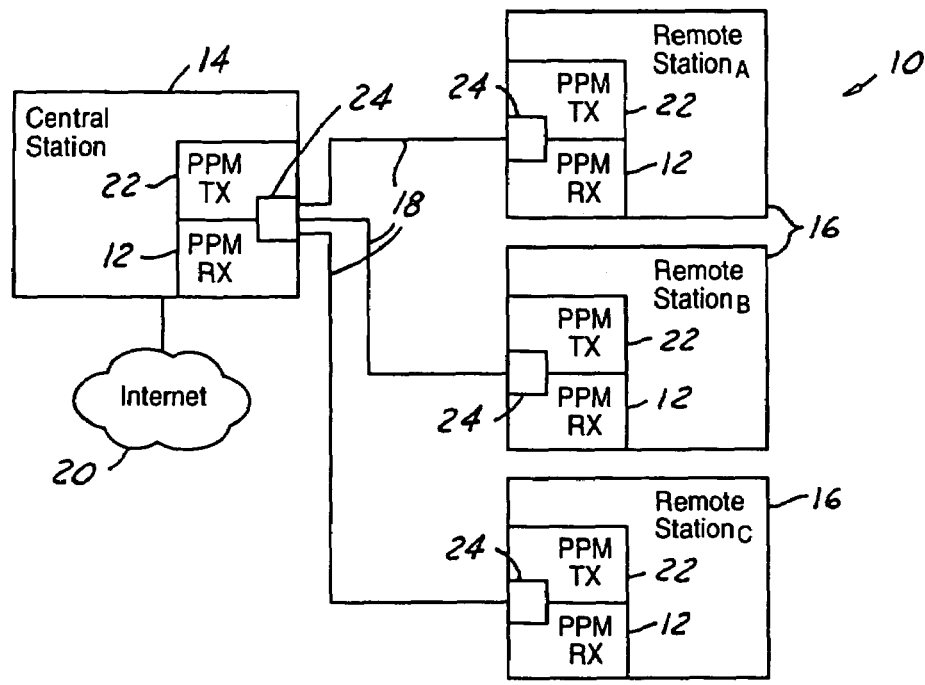
FIG. 1 is a block diagrammatic view of a communication system utilizing pulse position modulation (PPM) receivers in accordance with an embodiment of the present invention.

Referring now to FIG. 1, a block diagrammatic view of a communication system 10 utilizing PPM receivers 12 in accordance with an embodiment of the present invention is shown. The communication system 10 includes a central station 14 that is in communication with multiple remote stations 16 via fiber optic cable 18. The central station 14 is coupled to and provides access to the Internet 20 for the remote stations 16. The central station 14 and the remote stations 16 include the PPM receivers 12 and PPM transmitters 22 for receiving and transmitting communication signals therebetween. The receivers 12 and transmitters 22 are coupled to the fiber optic cable 18 via optic couplers 24. The receivers 12 and transmitters 22 are capable of supporting high data rate communication. High data rate communication refers to data rates of at least approximately 10 Gbits/s. The communication signals may include clock signals, data signals, pulse modulation signals, and other communication signals known in the art.

Referring now to FIG. 2, a schematic and block diagrammatic view of a PPM receiver 30 in accordance with an embodiment of the present invention is shown. The receiver 30 includes a clock receiver 32 and a data receiver 34 that receive reference clock signal(s) 36 and data signal(s) 38, respectively. The clock receiver 32 and the data receiver 34 may be in the form of photodiodes or some other electrical transducer known in the art. The clock signals 36 and the data signals 38 may be in the form of current signals, depending upon the receivers 32 and 34. In the embodiment as described, the data signal 38 is in the form of a PPM signal. The clock receiver 32 is coupled to a first transimpedance amplifier 40 and the data receiver 34 is coupled to a second transimpedance amplifier 42. The amplifiers 40 and 42 convert the clock signal 36 and the data signal 38 into voltage swing type signals for analog processing thereof. The clock signal 36 may be received separately from the data signal 38, as shown, or for some coding schemes maybe recovered from the data signal 38.

The first amplifier 40 has a first amplifier input 46 and a first amplifier output 48. The second amplifier 42 has a second amplifier input 50 and a second amplifier output 52. The first amplifier input 46 is coupled to the clock receiver 32 and the second amplifier input 50 is coupled to the data receiver 34. The first amplifier output 48 is coupled to a first one-shot timer circuit 54 and the second amplifier output 52 is coupled to a second one-shot timer circuit 56. The timer circuits 54 and 56 widen pulses within the clock signal 36 and the data signal 38. The widened clock signal is referred to as an electrical clock signal $E_{clk}$ and the widened data signal is referred to as an electrical data signal $E_{data}$. The amplifiers 40 and 42 may have reference terminals 58.

A clock recovery circuit 44 may be used instead of the clock receiver 32 and the amplifier 40 to recover the clock signal 36 from the data signal 38. The clock recovery circuit 44 may be coupled between the second amplifier output 52 and the first timer circuit input 60, as shown, between the second amplifier input 50 and the first amplifier input 46, or elsewhere as known in the art. The clock recovery circuit 44 may be in the form of a phase lock loop or in some other form known in the art.

The first timer circuit 54 has a first timer input 60 and a first timer output 62 and the second timer circuit 56 has a second timer input 64 and a second timer output 66. The first circuit output 62 is coupled to a clock circuit input 68 of a coordinating clock circuit 70 that has multiple clock circuit outputs 72. The clock circuit 70 separates the electrical clock signal $E_{clk}$ into multiple coordinating clock signals 74 having different phase. The clock circuit 70 may be in the form of a three-phase clock generator, as shown, or may be in some other form known in the art. The clock circuit 70 has the three outputs 72, which have coordinating clock signals A, B, and C, respectively. The clock circuit 70, although shown having a specific number of inputs and outputs, may include any number thereof.

A time-interleaving integrator circuit 76 is coupled to the clock circuit 70 and to the second timer circuit 56. The integrator circuit 76 provides an analog representation of the electrical data signal $E_{data}$ through the use of time-interleaving signal processing. The integrator circuit 76 includes multiple phase integrators 78. Each integrator 78 includes an integrator input 80, a hold input 82, a reset terminal 84, and an output 86. The integrator inputs 80 and the reset terminals 84 are coupled to the clock circuit outputs 72. Each of the hold inputs 82 are coupled to the second timer circuit output 66. The outputs 86 are coupled to the switches 88. The integrators 78 have analog output signals IntA, IntB, and IntC, respectively. Each integrator 78 may operate in an integration mode, a hold mode, or a reset mode, as is described in further detail below.

Each of the switches 88 has a switch input 90, a control terminal 92, and switch output 94. The switch inputs 90 are coupled to associated integrator outputs 86. The control terminals 92 are coupled to associated clock circuit outputs 72. The switch outputs 94 are coupled to a combiner 96, which sums the analog output of each switch 88 to form a resulting demodulated signal $V_{dem}$. The resulting signal $V_{dem}$ may be read at the output terminal 98.

In the embodiment as shown, the clock circuit 70 includes a first output 100, a second output 102, and a third output 104. The integrator circuit 76 includes a first phase integrator 106, a second phase integrator 108, and a third phase integrator 110. The switches 88 include a first switch 112, a second switch 114, and a third switch 116. The first output 100 is coupled to the second reset terminal 118, of the second integrator 108, and to the third control terminal 120, of the third switch 116. The second output 102 is coupled to the third reset 122, of the third integrator 110, and to the first control terminal 124, of the first switch 112. The third output 104 is coupled to the first reset 126, of the first integrator 106, and to the second control terminal 128, of the second switch 114.

Figure 3:
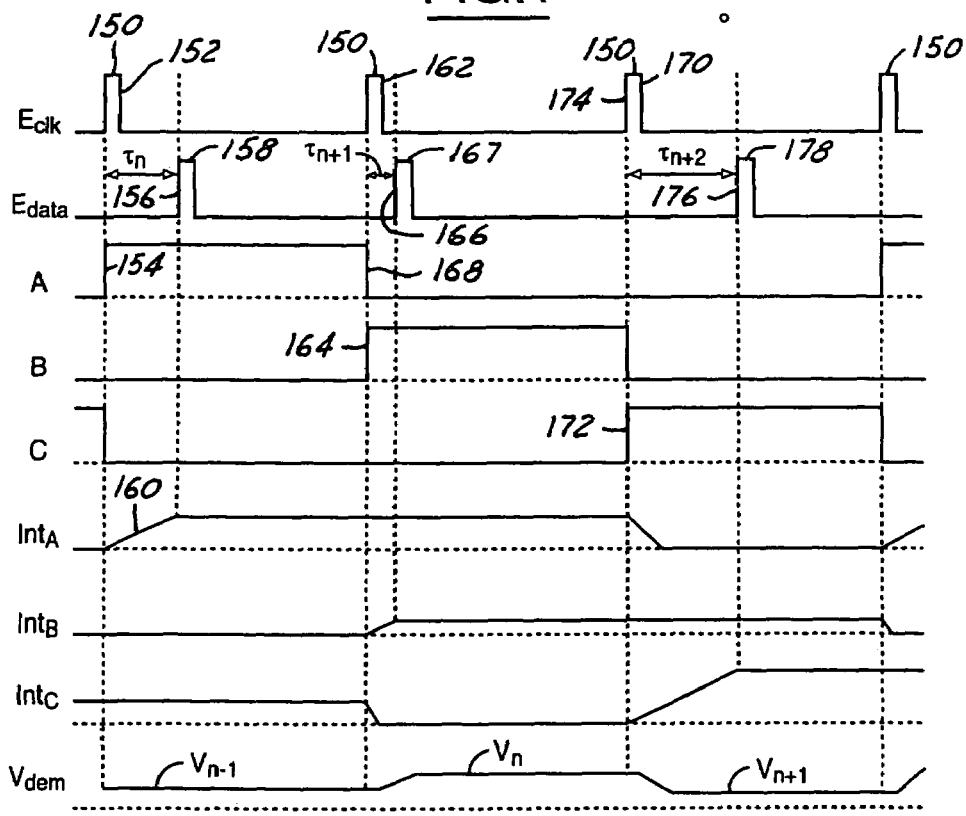
FIG. 3 is a timing diagram for signal outputs of a clock circuit and an integrator circuit of the PPM receiver of FIG. 2 and output of the PPM receiver in accordance with an embodiment of the present invention.

Referring now also to FIG. 3, a signal timing diagram for the clock circuit 70 the integrator circuit 76, and the receiver 30 of FIG. 2 in accordance with an embodiment of the present invention is shown. The timing diagram illustrates the relation between the electrical clock signal $E_{clk}$, the electrical data signal $E_{data}$, the coordinating clock signals A, B, and C of the integrators 78, the analog output signals IntA, IntB, and IntC, and the resulting signal $V_{dem}$. Each of the stated signals is shown as a respective voltage amplitude representation over time.

In operation, each symbol within the electrical data signal $E_{data}$ is encoded as the time delay between the rising edge of a pulse of the electrical clock signal $E_{clk}$ and the rising edge of a subsequent pulse of the electrical data signal $E_{data}$. Three sample time delays are shown and represented by $$\tau_n, \tau_{n+1}, \text{ and } \tau_{n+2}.$$

Pulses 150 of the electrical clock signal $E_{clk}$ trigger states of the clock circuit 70. The clock circuit 70 has three states to produce the coordinating clock signals A, B, and C.

In the first state, corresponding to a first clock pulse 152, the first integrator 106 commences integration with the rising edge 154 of the coordinating signal A and proceeds until switched into a hold mode by the rising edge 156 of the following or first data pulse 158. The integration is represented by the first ramp 160 having a fixed slope of the first analog output signal IntA. The first integrator 106 integrates at a constant rate over the time delay $$\tau_n$$

such that the first ramp 160 has an approximately fixed slope. By integrating with a constant rate, the time delay $$\tau_n$$

is linearly converted to a voltage representation. The first integrator 106 integrates until the rising edge 156 of the first data pulse 158 and then operates in the hold mode. With the rising edge 154, the second integrator 108 operates in the reset mode and the third switch 116 is closed. The second integrator 108 is reset to an initial condition or low state in response to the rising edge 154 of the coordinating signal A. The third integrator 110 operates in a hold mode as a result of a prior data pulse (not shown). Since the third switch 116 is in a closed state and the first switch 112 and the second switch 114 are in an open state, the resulting signal $V_{dem}$ is approximately set equal to the voltage of the third analog output signal IntC. Timing stages of the resulting signal $V_{dem}$ are represented by $V_{n-1}$, $V_n$, and $V_{n+1}$.

In the second state, corresponding to a second clock pulse 162, the first integrator 106 is in the hold mode, the second integrator 108 commences integration, and the third integrator 110 is in the reset mode. The first integrator 106 is in a hold mode due to the rising edge 156. The second integrator 108 commences integration with the rising edge 164 of the coordinating pulse B to convert the time delay $$\tau_{n+1}$$

into a voltage equivalent representation. The second integrator 108 operates in the integration mode until a rising edge 166 of the second data pulse 167. The rising edge 164 resets the third integrator 110. The first switch 112 is closed with the rising edge 164. The second switch 114 remains open whereas the third switch 116 is switched open in response to the falling edge 168 of the coordinating signal A. The resulting signal $V_{dem}$ is set approximately equal to the voltage of the first analog output signal IntA.

In the third state, corresponding to a third clock pulse 170, the first integrator 106 is reset, the second integrator 108 operates in the hold mode, and the third integrator 110 operates in the integration mode. The rising edge 172 of the coordinating signal C resets the first integrator 106. The second integrator 108 operates in the hold mode in response to the rising edge 166. The third integrator 110 operates in the integration mode in response to the rising edge 174 of the third clock pulse 170 and integrates until a rising edge 176 of the third data pulse 178. The first switch 112 is opened, the second switch 114 is closed, and the third switch 116 remains open. The resulting signal $V_{dem}$ is set approximately equal to the voltage of the second analog output signal IntB.

Thus, in turn, each of the three-phase integrators 78 1) integrate a data symbol (coded as a time delay), 2) hold the corresponding voltage of the data symbol for detection, and 3) are reset to an initial state from which integration can begin again. The time-interleaving design of the receiver 30 allows for a full clock cycle to be allotted for both reading the output voltage of the receiver 30 and for resetting each integrator 78, which alleviates the time constraints imposed by high clock frequencies.

Referring now to FIG. 4, a simplified schematic diagram of a sample integrator 200 that may be utilized within a PPM receiver in accordance with an embodiment of the present invention is shown. The integrator 200 includes three switches 202 and a current source 204. An integration switch 206 is coupled between and in series with a first capacitor 208 and the current source 204. The capacitor 208 has a positive terminal 210 and a negative terminal 212. The positive terminal 210 is coupled to a ground 214 and the negative terminal 212 is coupled to an output terminal 216. The integration switch 206 has a first integration leg 218, an integration control leg 220, and a second integration leg 222. The first leg 218 is coupled to the output terminal 216. The control leg 220 is coupled, for example, to the output of a set/reset latch (not shown), which may be included within the integrator 200. The set and reset inputs of the set/reset switch are coupled to the coordinating clock circuit outputs 72 and to the second timer output 66, respectively. The second leg 222 is coupled to the current source 204, which is in turn coupled to a voltage source 224.

A reset switch 226, having a first reset leg 228, a reset control leg 230, and a second reset leg 232, is coupled in parallel with the capacitor 208. The first leg 228 is coupled to the ground 214. The control leg 230 is coupled, for example, to the third output 104 of the clock circuit 70. The second leg 232 is coupled to the output 216.

A hold switch 234, having a first hold leg 236, a hold control leg 238, and a second hold leg 240, is coupled between the second integration leg 222 and the ground 214. The first leg 236 is coupled to the second integration leg 222. The control leg 238 is coupled, for example, to the inverting output of the set/reset switch stated above. The second leg 240 is coupled to the ground 214.

The integration switch 206 is switched on by the rising edge of a clock pulse, allowing the current source 204 to charge the capacitor 210 and in effect integrating a constant current to generate a voltage ramp proportionally over time. When a subsequent data pulse arrives, the coordinating signal received by the integration control leg 220 toggles the integration switch 206 open, switching the integrator 200 into a hold mode by switch 234. Either switch 206 or switch 234 is in a closed state during the stated modes. During the hold mode voltage of the output terminal 216 may be read. When the reset switch 226 is closed the capacitor 208 is shorted to the ground 214, thereby resetting voltage of the output 216 to approximately zero.

Figure 5:
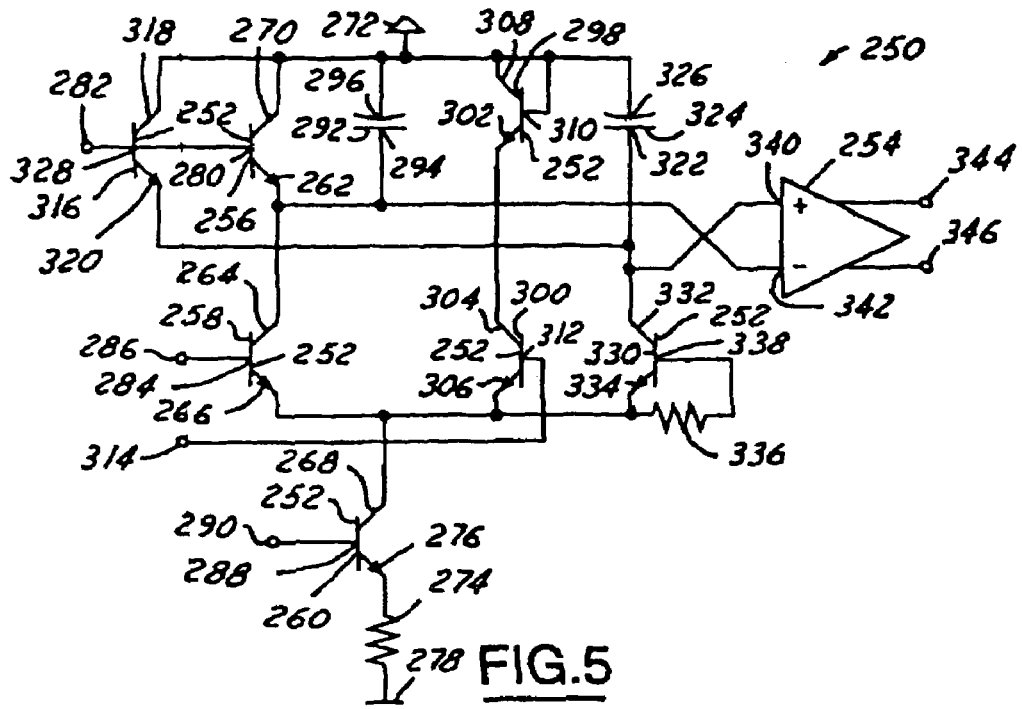
FIG. 5 is a detailed schematic diagram of a sample integrator that correlates with the schematic of the integrator of FIG. 4 in accordance with an embodiment of the present invention.

Referring now to FIG. 5, a detailed schematic diagram of a sample integrator 250 that correlates with the schematic of the integrator 200 in accordance with an embodiment of the present invention is shown. The integrator 250 includes seven transistors 252 and a buffer 254. Each transistor 252 has a respective emitter, base, and collector, which have associated numerical designators. The buffer 254 may be replaced with a differential buffer.

Collector and emitter legs of the first transistor 256, the second transistor 258, and the third transistor 260 are in series such that the first emitter 262 is coupled to the second collector 264 and the second emitter 266 is coupled to the third collector 268. The first collector 270 is coupled to the ground 272. A first resistor 274 is coupled between the third emitter 276 and a voltage source 278. The first base 280 is coupled to a reset terminal 282. The second base 284 is coupled to an integration terminal 286. The third base 288 is coupled to a bias voltage source 290.

A first capacitor 292, having a negative terminal 294 and a positive terminal 296, is coupled between the first emitter 262 and the ground 272. The negative terminal 294 is coupled to the first emitter 262 and the positive terminal 296 is coupled to the ground 272.

Collector and emitter legs of the third transistor 260, the fourth transistor 298, and the fifth transistor 300 are also coupled in series such that the fourth emitter 302 is coupled to the fifth collector 304 and the fifth emitter 306 is coupled to the third collector 268. The fourth collector 308 is coupled to the ground 272. The fourth base 310 is coupled to the ground 272. The fifth base 312 is coupled to a hold terminal 314.

The sixth transistor 316 has a sixth collector 318 that is coupled to the ground 272 and a sixth emitter 320 that is coupled to a negative terminal 322 of a second capacitor 324. A positive terminal 326 of the second capacitor 324 is coupled to the ground 272. The sixth base 328 is coupled to the reset terminal 282.

The seventh transistor 330 has a seventh collector 332 that is coupled to the negative terminal 322 and a seventh emitter 334 that is coupled to the third collector 268. A second resistor 336 is coupled between the seventh base 338 and the third collector 268.

The buffer 254 includes a non-inverting input 340, an inverting input 342, an output terminal 344, and an inverted output terminal 346. The non-inverting input 340 is coupled to the seventh collector 332. The inverting input 342 is coupled to the first emitter 262.

Referring now to FIGS. 4 and 5, the current source 204 is formed by the third transistor 260 and the first resistor 274. The bias voltage source 290 sets the amount of current flow through the third transistor 260. The second transistor 258 performs as the integration switch 206. The fifth transistor 300 performs as the hold switch 234. When the integration terminal 286 is high, representing reception of an integration signal, the current charges the first capacitor 292. When the integration terminal 286 is low, the current flows through the fourth transistor 298 and the fifth transistor 300, which is also when the output terminal 344 is read.

The buffer 254 cancels errors in the integration signal, such as parasitic errors. The seventh transistor 330 and the second capacitor 324 form a dummy voltage reference. The buffer 254 compares voltage across the first capacitor 292 with voltage of the dummy reference when generating an output signal, such as the resulting signal IntA. In comparing the voltage across the first capacitor 292 with the that of the dummy reference the buffer 254 cancels errors in the integration signal, since errors that are in the integration signal are also in the dummy reference.

After the output terminal 344 is read, the integrator 250 may be reset through use of the first transistor 256 and the sixth transistor 316 by pulsing the reset terminal 282 high.

Figure 6:
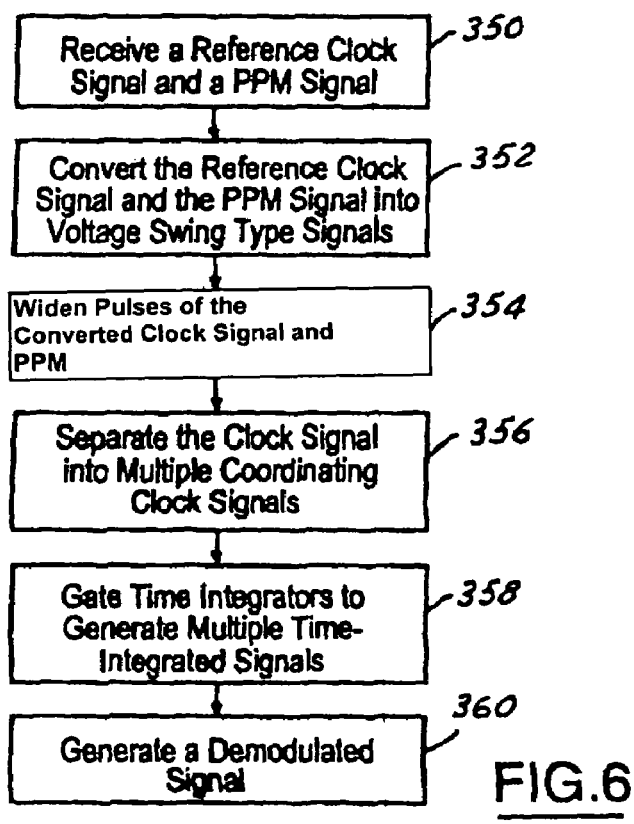
FIG. 6 is a logic flow diagram illustrating a method of extracting information from pulse position modulation signals in accordance with multiple embodiments of the present invention.

Referring now to FIG. 6, a logic flow diagram illustrating a method of extracting information from PPM signals in accordance with multiple embodiments of the present invention is shown. Although the method of FIG. 6 is described with respect to the receiver 30 and the embodiment of FIG. 2, it may be easily modified to apply to other receivers and embodiments of the present invention.

In step 350, the receiver 30 receives one or more PPM signals, such as the data signals 38, via the data receiver 34. The clock receiver 32 receives the reference clock signal 36 and the data receiver 34 receives the data signal 38, simultaneously.

In step 352, the transimpedance amplifiers 40 and 42 convert the clock signal 36 and the data signal 38 that are received in the form of current signals into voltage swing type signals.

In step 354, the timer circuits 54 and 56 widen the pulses of the converted clock signal 36 and the data signal 38. Duration of the clock signal 36 and the data signal 38 are increased, to ease and improve accuracy in detection of each pulse therein.

In step 356, the clock circuit 70 separates the clock signal 36 into the out-of-phase coordinating clock signals A, B, and C.

In step 358, the integrators 78 are clocked or gated to generate the time-integrated signals IntA, IntB, and IntC in response to the coordinating clock signals A, B, and C and the data signal 38. The integrators 78 begin integration of a constant current, set by the source 204, in response to the coordinating clock signals A, B, and C. The integrators 78 cease integration in response to the data signal 38.

In step 360, the resulting demodulated signal $V_{dem}$ is generated through the gating and summation of the time-integrated signals IntA, IntB, and IntC.

The above-described steps are meant to be an illustrative example; the steps may be performed sequentially, simultaneously, synchronously or in a different order depending upon the application.

The present invention provides a robust PPM receiver that is capable of receiving high data rates, has high signal resolution, and improved signal-to-noise performance.

While the invention has been described in connection with one or more embodiments, it is to be understood that the specific mechanisms and techniques which have been described are merely illustrative of the principles of the invention, numerous modifications may be made to the methods and apparatus described without departing from the spirit and scope of the invention as defined by the appended claims.

The invention claimed is:

1. A communication receiver comprising:
    a data receiver receiving at least one pulse-position modulated signal;
    a clock circuit separating a reference clock signal into a plurality of coordinating clock signals;
    a plurality of time integrators gated to generate a plurality of time-integrated signals in response to said at least one pulse-position modulated signal and said plurality of coordinating clock signals;
    a combiner forming a demodulated signal from said plurality of time-integrated signals;
    a first transimpedance amplifier converting said reference clock signal from being in the form of a current signal into a first voltage swing signal; and
    a second transimpedance amplifier converting said at least one pulse-position modulated signal from being in the form of a current signal into a second voltage swing signal;
    wherein said combiner sums at least a portion of said plurality of time-integrated signals to form said demodulated signal.

2. A communication receiver as in claim 1 wherein said data receiver comprises at least one electrical transducer.

3. A communication receiver as in claim 2 wherein said at least one electrical transducer comprises at least one photodiode.

4. A communication receiver as in claim 1 further comprising a clock receiver receiving said reference clock signal.

5. A communication receiver as in claim 4 wherein said clock receiver comprises at least one electrical transducer.

6. A communication receiver as in claim 5 wherein said at least one electrical transducer comprises at least one photodiode.

7. A communication receiver as in claim 1 further comprising a clock recovery circuit recovering said reference clock signal.

8. A communication receiver as in claim 7 wherein said clock recovery circuit comprises a phase lock loop.

9. A communication receiver as in claim 1 further comprising a one-shot timer circuit widening pulses within said reference clock signal.

10. A communication receiver as in claim 1 further comprising a one-shot timer circuit widening pulses within said at least one pulse-position modulated signal.

11. A communication receiver as in claim 1 further comprising a plurality of switches coupled to said plurality of time integrators, said combiner forming said demodulated signal in response to state of said plurality of switches.

12. A communication receiver as in claim 1 wherein plurality of time integrators are gated to begin integration in response to the plurality of coordinating clock signals.

13. A communication receiver as in claim 1 wherein said plurality of time integrators are gated to cease integration in response to said at least one pulse-position modulated signal.

14. A communication receiver as in claim 1 wherein said plurality of time integrators integrate a constant input value in response to said at least one pulse-position modulated signal and said plurality of coordinating clock signals.

15. A communication receiver as in claim 14 wherein said plurality of time integrators comprise at least one current source providing said constant value.

16. A communication receiver as in claim 1 wherein said plurality of time integrators comprise:
    at least one integration switch;
    at least one hold switch; and
    at least one reset switch.

17. A communication system as in claim 16 wherein said plurality of time integrators perform integration in response to said at least one integration switch.

18. A communication system as in claim 16 wherein said plurality of time integrators hold a voltage value in response to said at least one hold switch.

19. A communication system as in claim 16 wherein said plurality of time integrators reset a voltage value to a nominal value in response to said at least one reset switch.

20. A communication system comprising:
    a transmitter generating at least one pulse-position modulated signal; and
    a communication receiver comprising;
    a data receiver receiving said at least one pulse-position modulated signal;
    a clock circuit separating a reference clock signal into a plurality of coordinating clock signals;
    a plurality of time integrators gated to generate a plurality of time-integrated signals in response to said at least one pulse-position modulated signal and said plurality of coordinating clock signals;
    a combiner forming a demodulated signal from said plurality of time-integrated signals;
    a first transimpedance amplifier converting said reference clock signal from being in the form of a current signal into a first voltage swing signal; and
    a second transimpedance amplifier converting said at least one pulse-position modulated signal from being in the form of a current signal into a second voltage swing signal;
    wherein said combiner sums at least a portion of said plurality of time-integrated signals to form said demodulated signal.

21. A communication receiver as in claim 20 further comprising a clock recovery circuit recovering said reference clock signal.

22. A communication receiver as in claim 20 further comprising a one-shot timer circuit widening pulses within said reference clock signal.

23. A communication system comprising:
    a first station having a transmitter generating at least one pulse-position modulated signal; and
    a second station having a communication receiver comprising;
    a data receiver receiving said at least one pulse-position modulated signal;
    a clock circuit separating a reference clock signal into a plurality of coordinating clock signals;
    a plurality of time integrators gated to generate a plurality of time-integrated signals in response to said at least one pulse-position modulated signal and said plurality of coordinating clock signals;
    a combiner forming a demodulated signal from said plurality of time-integrated signals;
    a first transimpedance amplifier converting said reference clock signal from being in the form of a current signal into a first voltage swing signal; and
    a second transimpedance amplifier converting said at least one pulse-position modulated signal from being in the form of a current signal into second a voltage swing signal;
    wherein said combiner sums at least a portion of said plurality of time-integrated signals to form said demodulated signal.

24. A method of extracting information from pulse-position modulated signals comprising:
    receiving at least one reference clock signal;
    recovering said reference clock signal from said at least one pulse-position modulated signal;
    receiving at least one pulse-position modulated signal;
    separating a reference clock signal into a plurality of clock signals;
    converting said reference clock signal from a current signal into a first voltage swing signal;
    converting said at least one pulse-width modulation signal from a current signal into a second voltage swing signal;
    gating a plurality of time integrators to generate a plurality of time-integrated signals in response to said at least one pulse-position modulated signal and said plurality of clock signals; and
    generating a demodulated signal from said plurality of time-integrated signals.

25. A method as in claim 24 further comprising widening pulses within said reference clock signal.

26. A method as in claim 24 further comprising widening pulses within said at least one pulse-position modulated signal.

27. A method as in claim 24 wherein separating said reference clock signal into a plurality of clock signals comprises generating said plurality of clock signals out-of-phase from each other.

28. A method as in claim 24 wherein gating said plurality of time integrators comprises beginning integration in response to the plurality of coordinating clock signals.

29. A method as in claim 24 wherein gating said plurality of time integrators comprises ceasing integration in response to said at least one pulse-position modulated signal.

30. A method as in claim 24 wherein gating said plurality of time integrators comprises integrating a constant current in response to said at least one pulse-position modulated signal and said plurality of coordinating clock signals.

31. A method of demodulating communication signals comprising:
   receiving at least one pulse-position modulated signal and at least one reference clock signal, converting said at least one reference clock signal and said pulse-position modulated signal into voltage swing type signals;
   separating said reference clock signal into a plurality of coordinating clock signals;
   widening pulses within said reference clock signal;
   gating a plurality of time integrators to generate a plurality of time-integrated signals comprising;
      beginning integration in response to the plurality of coordinating clock signals; integrating a constant value; and
      ceasing integration in response to said at least one pulse-position modulated signal; and
   generating a demodulated signal from said plurality of time-integrated signals.

32. A method as in claim 31 further comprising recovering said reference clock signal.

* * * * *